United States Patent [19]

Hoge, Jr. et al.

[11] Patent Number: 5,105,056
[45] Date of Patent: Apr. 14, 1992

[54] ELECTROMAGENTIC SHIELDING WITH DISCONTINUOUS ADHESIVE

[75] Inventors: William C. Hoge, Jr., Palmyra; Merle C. Ferris, Rochester, both of N.Y.

[73] Assignee: Schlegel Corporation, Rochester, N.Y.

[21] Appl. No.: 604,562

[22] Filed: Oct. 26, 1990

[51] Int. Cl.⁵ .............................................. H05K 9/00
[52] U.S. Cl. ............................ 174/35 GC; 174/35 MS
[58] Field of Search .......... 174/35 GC, 35 R, 35 MS; 219/10.55 D, 10.55 R; 361/424; 277/227, 228, 229, 230, 235 R, 235 A; 156/60, 295

[56] References Cited

U.S. PATENT DOCUMENTS 4,857,668 8/1989 Buonanno ...................... 174/35 GC
4,988,550 1/1991 Keyser et al. ...................... 428/40

OTHER PUBLICATIONS

Severinsen, Gasket that Block EMI, vol. 47, No. 19 (Aug. 7, 1975).

*Primary Examiner*—Leo P. Picard
*Assistant Examiner*—Bot Ledynh

*Attorney, Agent, or Firm*—Eckert Seamans Cherin & Mellott

[57] ABSTRACT

A shield blocks passage of electromagnetic energy through a seam of indefinite length between conductive elements and is adhesively attached to at least one of the elements. A preferably non-conductive adhesive is disposed on a conductive surface of a seal in a discontinuous pattern along the length of the seam, defining area of 5–40% adhesive for physically attaching the conductive surface, separated by 60–95% exposed areas for direct electrical contact. The seal can include a compressible body or can be defined by a conductive sheet, for example a fabric provided with a plating or other conductive coating. The areas of adhesive preferably define longitudinally non-overlapping inclined lines extending laterally across the seam. A release liner can removably attach to the adhesive. In a preferred embodiment the conductive surface is the surface of a compressible seal body, such as a conductive sheath on a compressible core. A conductive path extends without interruption along the length of the seam and across the lateral width of the seam at the adhesive lines, providing improved physical attachment and conductivity characteristics for the shielded seam as a whole.

26 Claims, 2 Drawing Sheets

ELECTROMAGENTIC SHIELDING WITH DISCONTINUOUS ADHESIVE

BACKGROUND OF THE INVENTION

1. Field of the Invention

This invention relates to the field of electromagnetic shielding, including conductive seals and gaskets for sealing between abutted parts of conductive bodies, and also to shielding material in sheet form, applied as a barrier to electromagnetic radiation passing into or out of enclosures, cables, conduits and the like. In particular, the invention concerns such shielding seals, gaskets and/or sheets wherein the material of the shield is affixed to a conductive surface by a discontinuous and preferably nonconductive adhesive.

2. Prior Art

Shielding against electromagnetic interference (EMI) involves providing a conductive barrier in which currents induced by incident electromagnetic fields are grounded and/or dissipated in eddy currents. Conductive seals and gaskets typically are used to render continuously conductive the junction of an abutment between conductive parts of the enclosures of electrical or electronic equipment. The conductive parts of an enclosure may be relatively movable, as in the case of a door of a cabinet, or the conductive parts can be intended to remain abutted, as in the case of panels which are held together by fasteners. The shielding of cables and the like typically involves surrounding the entire cable in a shield material Similarly, conductive seals and gaskets may have a conductive sheet material wrapped or wound on a compressible form. While it is possible to form a seamless tube of conductive sheet material for a cable shield, it is also possible to wrap the cable with conductive sheet material, defining a longitudinal or helical seam at which the conductive material must be joined so as to conduct across the seam. Seams are also defined in use between conductive material of a seal or gasket and the cabinet panels or the like to which the seal or gasket is affixed.

The shielding may be intended either to confine or to exclude electromagnetic interference. In connection with microwave ovens and the like, for example, the objective is to confine the microwave field to the inside of the enclosure. In connection with communications equipment and the like, the objective may be either or both of isolating the circuitry within an enclosure from ambient electromagnetic interference (EMI) and/or protecting other equipment from interference generated in the shielded equipment. Shielding can protect against potential damage as well as potential improper operation due to induction of currents by external fields. Apart from interference, electromagnetic shielding techniques may be employed to protect vulnerable circuitry from damage due to electromagnetic pulses, such as are produced by nuclear detonations.

Whether the plane or surface to be shielded is between movable or immovable conductive surfaces, or whether the shield material is to be wrapped around an element without bridging across conductive surfaces other than the shield material itself, the need to conductively fix the shield material at least at one seam is common to all shielding arrangements. In each case the shield resides across the path of incident electromagnetic radiation, defining a substantially continuously conductive body (either alone or in conduction with conductive panels or the like), so as to block propagation of electromagnetic fields.

A conductive gasket or seal is known wherein a conductive sheath of woven or knitted wire encloses a compressible core. This form of seal can be mounted, for example, in a slot in a first conductive panel or body and arranged to bear against a second panel or body brought into abutment with the first. In movable panel arrangements, one of the panels normally carries the seal and the other of the panels simply abuts against the seal. If the sealed panels are to remain immovable, the seal can be attached to one or both.

Typically, such a seal is attached to the conductive panel or the like at least partly by an adhesive at the connecting seam. For maximum shielding efficiency there is a need to avoid undue electrical resistance across the seam, i.e., between the seal and the surface against which it abuts. The resistance normally includes electrical resistance due to the adhesive disposed between the conductive panel and the conductive material of the seal. The typical technique for attaching the seal to the conductive panel is to place a continuous bead of conductive adhesive on the conductive sheath of the seal, at least on one side of the seal to be disposed against a conductive panel. Conductive adhesive is rendered conductive by conductive particles disposed in the adhesive binder, defining a conductive path through the adhesive due to surface contact of the particles within the binder. The binder typically consists essentially of a nonconductive elastomer which otherwise would function as an insulator, or in connection with adhesive disposed between conductive panels, as a dielectric.

Conductive adhesives tend to break down over time The conductive particles can migrate in the elastomeric binder, particularly with compression and decompression of the seal. Often the result of cycles of compression and decompression is that the conductive particles tend to become spaced from the surface of the adhesive as the elastomer flows viscously around the particles. This causes a gradual decrease in the conductivity of the seal as a whole, due to the increase in resistance across the adhesive. Additionally, the conductive particles in the binder of the adhesive can break down over time due to mechanical and environmental effects. The breakdown of the conductive portion of the adhesive is accelerated where the conductive sheath of the seal is made of a wire mesh or the like, wherein movement of the wire portions of the sheath relative to the viscous binder of the adhesive kneads the adhesive material In U.S. Pat. No. 4,857,668—Buonanno, a seal is disclosed which includes a conductive sheath on a resilient foamed core. A preferred material for the sheath is ripstop nylon, a polymer fabric, and the filaments of the fabric can be plated with a conductive material (e.g., metal). The sheath can be mounted to one of the sealed panels by means of conductive clips or by engagement in a groove or the like. Alternatively, the seal can be attached to its panel via a conductive adhesive. The sheath according to Buonanno can be rendered conductive at least partly by an outer conductive coating of relatively inert particles such as carbon black in a binder of elastomer such as urethane. The conductive particles provide a current path, while the elastomeric binder as well as the inert conductive particles avoid presenting an abrasive surface or a surface subject to corrosion. Any corrosion on the surfaces in contact between a conductive seal and a conductive panel tends to reduce the smoothness of the seal, thereby presenting a possibility of gaps, and also tends to increase surface resistance, leading to reduced shielding effectiveness of the seal. The particular sheath composition is an important consideration and is given substantial attention by those skilled in the art.

Other forms of seals are also known for placement between conductive panels. The seals range from wholly metallic sheet metal structures, for example with spring-like metal forms protruding from a metal strip, or helically wound sheet metal strips, to resilient forms of rubber or plastic enclosed in woven, knitted or unwoven batts of conductive sheathing. In each case the seal provides conductive surfaces to be placed in contact with the conductive panels to be bridged by a conductive material for effecting an EMI shield. All these forms must be attached to the conductive panels, typically by an adhesive.

A seal formed in part of a sheet of conductive sheathing can be wrapped around a resilient core to form a seal or gasket to reside between conductive panels. In the same manner, a conductive sheath can be wrapped around a cable or the like. The sheathing may be formed as a tube, however, wrapping is more convenient. When wrapping an elongated strip around a core, cable or other elongated structure, the lateral edges of the sheathing must be conductively attached together along a longitudinal seam to ensure that the entire sheath is uniformly conductive. Similarly, when applying a conductive sheath (without a core) to a surface to be shielded, the sheath must be affixed to the surface both conductively and in a manner that physically retains the sheath in place. The physical retention of the sheath often requires an adhesive.

Assuming the conductive sheath or seal is to be attached (to itself or to conductive panels) in a routine manner with the object of improving the continuity and decreasing the resistance of the conductive path across the junction of the attachment, a conductive adhesive will provide a continuous conductive path. However, as noted above, conductive adhesives tend to break down and become less conductive over time. The inherent resistance of the adhesive is interspersed between the conductive elements at the junction, thereby increasing electrical resistance along the conductive path between the sealed panels. Conductive adhesive is more expensive than nonconductive adhesive due to the need for the additional conductive particles. The added particles render the adhesive less sticky than a comparable quantity of nonconductive adhesive due to the fact that the conductive particles displace the sticky adhesive material, thus requiring a greater quantity of adhesive for a given strength joint. For all these reasons, it would be helpful to avoid or minimize reliance on conductive adhesive for the electrical and/or mechanical joining of the parts of conductive sheaths and panels.

According to the present invention, the conventional use of conductive adhesive applied as a continuous bead or surface has been reconsidered. Rather than mounting a conductive sheathed seal body on a continuous strip of conductive adhesive, and rather than attaching a conductive sheet either at its edges or to a full surface, adhesive is applied discontinuously, for example in the form of regularly spaced adhesive dots, or preferably along spaced lines, at the conductive and physical junction of the sheath or seal. Contrary to expectations, the lack of an adhesive material in the area between the adhesive lines or dots does not reduce the effectiveness of the seal, particularly if the adhesive is arranged in the form of longitudinally non-overlapping lines inclined laterally across the connecting seam of the seal. In fact the seal is more effective because greater direct contact between the panels and the conductive sheath of the seal provides an overall conductive EMI shielding barrier that intersperses only the contact resistance of the sheath and the panel between the abutting elements along the path of electromagnetic propagation. While conductive adhesive can be used, a less expensive nonconductive adhesive is preferred, because the direct contact between the surface of the conductive sheath and the panel provides at least as good continuity along the length of the junction to compare favorably with conductive junctions having a conductive adhesive disposed continuously between the sheath and the panel, or at overlapped sections of the sheath. Moreover, the adhesion of the seal material at the seam is improved over conductive adhesives of equal amount, and the conductivity of the seal does not deteriorate over its lifetime.

SUMMARY OF THE INVENTION

It is an object of the invention to reduce the cost and complexity of a mounting for a conductive seal, while retaining full effectiveness of the seal for electromagnetic shielding between conductive panels by minimizing electrical resistance along a path between such panels having an interspersed adhesively attached gasket or seal.

It is another object of the invention to improve the conductivity in the long term of shielding junctions, for example between conductive seals and conductive panels to which the seals are attached, or between conductive sheet materials or sheaths and other conductive elements to which the sheet or sheath material is physically and electrically connected.

It is also an object of the invention to improve the conductive characteristics of a sheet, seal or gasket by maximizing surface contact between the conductive elements which are abutted in use to define a barrier to electromagnetic propagation.

It is another object of the invention to enable the use of inexpensive nonconductive adhesive in a conductive EMI shielding seal.

It is still another object of the invention to provide a connection means for a seal or sheath that is easy to use, physically strong and of moderate cost.

These and other objects are accomplished by a method and apparatus which shield against passage of electromagnetic energy through an abutment between conductive elements The shield may be formed by a sheet, seal or gasket including a conductive shield body of indefinite length to be mounted adhesively to at least one conductive body, which other conductive body, in an overlapped sheet shield can be another portion of the shield material. The shield body may be a seal with a conductively sheathed compressible structure to be attached to and abutted against conductive panels, or can include a sheet material to be conductively fixed by one or both edges to a conductive panel or to itself.

An adhesive is disposed on a surface of the conductive body, the adhesive being discontinuous along the length of the shield body, thereby defining areas of adhesive separated by areas wherein the conductive shield body is exposed for direct surface contact. The areas of adhesive and the areas wherein the conductive shield body is exposed can define a regular repetitive pattern along the length of the junction, such as a pattern of spaced dots or lines. A series of spaced adhesive lines, inclined relative to the length of the seam or junction, can extend across a lateral width of the junction, preferably in a longitudinally non-overlapping manner. The proportion of adhesive space to exposed space at the junction is preferably about 40% adhesive to 60% exposed, and depending on the extent of mechanical attachment needed, can be as little as 5% adhesive to 95% exposed. The conductive shield body can be supplied with a release liner removably attached to seal via the adhesive, such that the liner is pulled off to expose the adhesive for mounting the shield body. The adhesive is preferably a nonconductive hot melt adhesive, but a conductive adhesive is also possible. When the shield body is affixed, a conductive path is provided, including surface contact at the exposed areas of the shield. According to the embodiment wherein inclined lines of adhesive are disposed along the junction, the adhesive lines can be arranged in a laterally non-overlapping arrangement to provide a single thickness of adhesive line at all points along the junction.

BRIEF DESCRIPTION OF THE DRAWINGS

There are shown in the drawings the embodiments of the invention as presently preferred. It should be understood, however, that the invention is not limited to the exemplary embodiments shown, and is capable of embodiment in other specific forms in accordance with the scope of the invention as claimed. In the drawings.

DETAILED DESCRIPTION OF THE PREFERRED EMBODIMENTS

The invention concerns the conductive connection of parts to block electromagnetic radiation, and is applicable to a number of types of shielding apparatus to be bridged at a seam with a conductive material. The conductive material bridging the seam can be more or less flexible and can be thick or thin, depending on the particular application. In each case, a discontinuous adhesive material is applied to affix the conductive material or shield at one or both of the edges of the seam.

Figure 1:
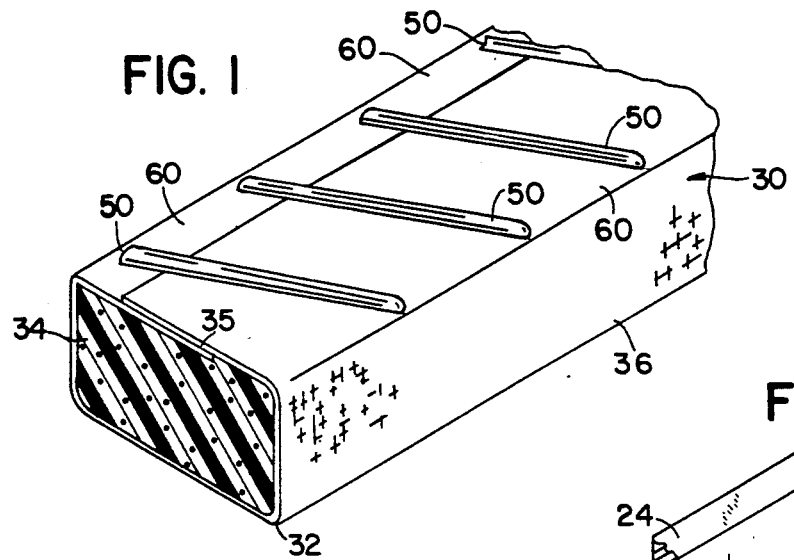
FIG. 1 is a perspective illustration of a seal or gasket according to the invention, with discontinuous adhesive applied in the form of inclined non-overlapping lines.

FIG. 1 is a perspective illustration of a compressible seal or gasket according to the invention, including an illustration of the cross section of the seal body at the end shown. The seal body can be of any length, preferably long enough to encompass the full length of the line or seam to be sealed against passage of electromagnetic interference (EMI). The shield, in this case the compressible seal, resides along a junction between conductive panels, and by conductively bridging between the panels provides a continuous conductive barrier against the propagation of electromagnetic interference either into or out of the area encompassed by the panels and the shield.

The seal body defining the shield 30 shown in FIG. 1 includes a conductive sheath 32 on a compressible core 34. The seal body can be substantially as described in U.S. Pat. No. 4,857,668—Buonanno, namely with a foamed elastomer core and a sheath of metal plated or conductively coated ripstop nylon. An anti-abrasive coating can be applied on the external surface of the sheath 32, formed of conductive particles (e.g., conductive carbon black) suspended in an elastomeric binder in sufficient concentration to obtain with the conductive sheath an overall conductive body. U.S. Pat. No. 4,857,668—Buonanno is hereby incorporated. It is also possible to employ the invention with other forms of shielding seal structures, as discussed hereinafter, for example seals with wire mesh woven or knitted around a resilient core, and wholly metallic shielding seals, for example with helically wound metal strips or formed spring-like metal tongues protruding from a strip attachable to one panel and resiliently bearing against the opposed panel. Other forms of shield seals, as well as shields having a sheet of conductive material, can be attached by an adhesive according to the invention.

Figure 2:
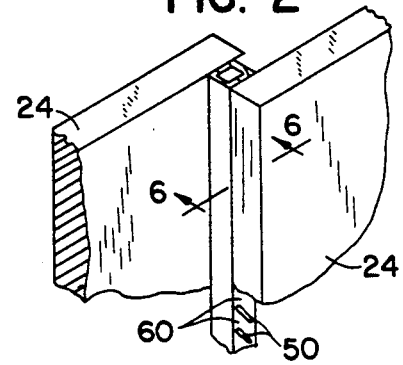
FIG. 2 is an elevation view showing the seal of FIG. 1, interspersed between two conductive panels.

FIG. 2 shows a shielding seal of the type shown in FIG. 1, interspersed between conductive bodies or panels 24, for example a movable door panel and a stationary cabinet panel against which the door panel rests when closed. The shielding seal provides a conductive path bridging across any space which may be defined between the two panels 24, 24 due to minor misalignment, surface irregularities and the like. The seal thereby blocks the propagation of electromagnetic interference and the like, in either direction through the opening otherwise defined between the panels.

When in operative position, the shield strip or body 30 is fixed to at least one of the panels via an adhesive disposed on the shield, e.g., on a surface of a conductive sheath. The adhesive is discontinuous along the length of the seal body, thereby defining a plurality of areas 50 of adhesive for physically attaching the shield to at least one of the panels, separated by areas 60 wherein the conductive material of the shield (e.g., the conductive sheath) is exposed directly for conductive surface contact with the panels.

The sheathing 32 of the shield in the embodiment of FIGS. 1 and 2 is wrapped circumferentially around a compressible core 34 of the shield. Accordingly, an elongated longitudinal seam 35 is defined where the sheathing overlaps itself, the edges of the sheathing at the seam being in conductive contact such that the shield as a whole is uniformly conductive across the panels. This seam 35 of the sheathing 32 can also be affixed via a discontinuous adhesive according to the invention. The invention is described primarily with respect to a compressible seal adhesively fixed to one panel and simply abutted against a relatively movable opposed panel. The seal can be attached to both panels in an embodiment wherein the panels are to remain fixed in abutment, the seal thus being used in the manner of a fixed gasket. The adhesive attachment of the seal to a conductive body also applies to the attachment of edges of sheathing to define a longitudinal or helical conductive seam, and to attachment of other forms of conductive sheets and strips to conductive bodies to be shielded.

In the exposed areas 60, the conductive shield material, in the case of FIGS. 1 and 2 the sheath, is urged by the compressible foam core 34 to bear directly against the panel to which the seal body is attached. The surface of the conductive sheath bearing against the panel is made discontinuous along the length of the seal by the areas 50 of adhesive. On the opposite panel, however, the foam core holds the conductive sheath in continuous contact. In a similar manner the pressure of spring-like seals of sheet metal and the like urges a surface of the conductive shield body against the opposite panel.

Figure 3:
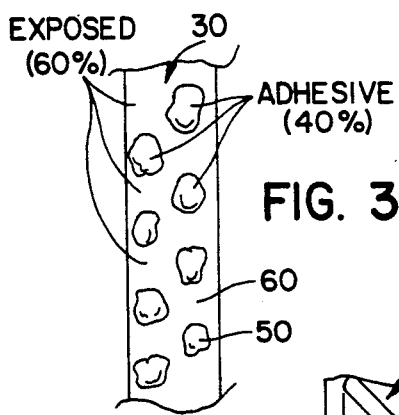
FIG. 3 is a diagrammatic plan view showing the proportion of exposed area to adhesive area, according to an embodiment wherein the adhesive is applied as spaced dots.

On the attachment side(s), the areas 50 of adhesive and the areas 60 wherein the conductive shield material is exposed define a regular repetitive pattern along the length of the seal. The pattern can be simple spots or dots of adhesive as shown in FIG. 3, but preferably is arranged as a pattern of longitudinally non-overlapping lines extending laterally across the seam, to maximize both the extent of conductive surface contact and the extent of physical attachment of the material across the seam.

The particular dimensions of the adhesive areas are in part a function of the dimensions of the seal body and in part a function of the required extent of physical attachment. For larger seals and/or seals which are to be more securely affixed, larger adhesive areas are preferable. The proportion of adhesive area to exposed area can vary between a minimum adhesive arrangement having only enough adhesive to barely hold the seal in place, for example at least 5% adhesive area to 95% exposed area. The proportion of adhesive can range from 5% to 40%, to exposed area of 95% to 60%. For better adhesion the relatively larger proportions of adhesive are needed. In order to obtain favorable conductivity characteristics together with good adhesive bonding to ensure that the seal remains attached to panel 24 or the like, the areas 50 of adhesive and the exposed areas 60 preferably are provided in a proportion of substantially 40% adhesive area to 60% exposed area.

FIGS. 1-6 illustrate a seal having a rectangular cross section, for example of about 3 by 5 mm. According to FIG. 3, which shows the higher proportion of adhesive, adhesive spots on the wider side of the rectangular form seal are arranged in a non-overlapping manner, about 2 or 3 mm in diameter and spaced on 1 cm centers. This arrangement places a relatively larger proportion of the surface in contact with the panel and provides good adhesive bonding to hold the seal in place.

Figure 4:
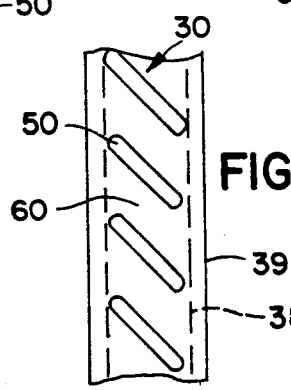
FIG. 4 is a partial section view through a junction of the seal and a panel, along line 6—6 in FIG. 2, showing the seal as compressed.

In a preferred embodiment as shown in FIG. 4, the adhesive defines a regular repetitive pattern of lines along the length of the seal. The lines are inclined laterally of the longitudinal axis of the seam, and can extend laterally across the full width of the seam. In FIG. 4 the seal is shown compressed (i.e., between panels 24). As a result of compression, the seal becomes widened slightly such that the adhesive lines do not extend clear to the edges 39, although the adhesive initially extended to the at-rest edges 38 of the seal, shown in broken lines.

The areas of adhesive define lines which are non-overlapping as viewed laterally of the seam. The end of each of the lines is longitudinally coextensive and laterally spaced from an end of a next one of the lines. As a result, the seam is provided with an equal lateral width of adhesive at substantially every longitudinal point along the longitudinal extension of the seam. The adhesive as thus applied provides a secure attachment to the conductive element to which the adhesive attaches the seal. At the same time, the pattern is such that at every longitudinal point along the seam there is a substantial exposed conductive area, considering the lateral extension of the seam (i.e., the adhesive occupies a relatively small part along any lateral line across the seam). This arrangement leads to good mechanical attachment and electrical shielding attributes.

Figure 5:
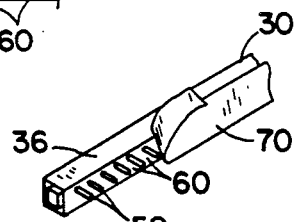
FIG. 5 is a perspective view showing the seal with a release liner.

Preferably, the conductive seal surface is supplied with a release liner, for example a coated strip of paper, removably attached to the seal via the adhesive as shown in FIG. 5. The user peels the release liner from the adhesive prior to attaching the seal across the seam. Inasmuch as the adhesive lines are longitudinally coextensive and the release liner is peeled longitudinally from the seal, the release liner peels continuously upward from the adhesive, rather than by discontinuously popping free at the exposed areas.

The same longitudinally continuous and laterally discontinuous nature of the adhesive pattern as shown, provides secure mechanical connection when the seal is installed. Moreover, the seal is equally conductive with the conductive element to which it is attached, at all longitudinal points along the seam because the proportion of exposed area to adhesive area does not vary. Due to these aspects, it is possible to obtain as good or better conductivity (and therefore shielding effectiveness across the seam) with a nonconductive adhesive, as a seal having a continuous conductive adhesive bead extending all along the seal parallel to the longitudinal axis thereof.

Of course a conductive adhesive can be used if desired. Inasmuch as the conductivity of the seal as a whole is obtained substantially through surface contact of the conductive sheath of the seal and the panels 24, a nonconductive adhesive also functions quite well. A preferred nonconductive adhesive material is hot melt adhesive. The adhesive can be applied in a production setup for example by passing the seal by an adhesive dispensing head which operates intermittently at the required rate, or which is arranged to sense the linear passage of the seal and to dispense a quantity of adhesive at the required spacing. Alternatively, the adhesive can be "printed" on the conductive sheath, using an applicator wheel to which lines of adhesive are applied at regular spaces around the circumference, and transferred to the seal.

Figure 6:
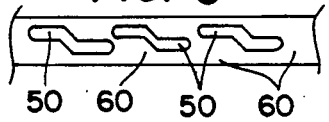
FIG. 6 is a plan view of an alternative embodiment, with a different pattern of discontinuous adhesive.

The pattern of adhesive can be varied while retaining the non-overlapping arrangement described. In FIG. 6, a different shape of adhesive area is provided, wherein parts of the adhesive lines run parallel to the seal. While the shape of the adhesive can be varied, for example to provide particular characteristics in the adhesive bonding of the seal body and the panel, in each case sufficient space 60 between the adhesive areas 50 is provided to ensure good conductive surface contact between a substantial proportion of the seal body and the panels.

Figure 7:
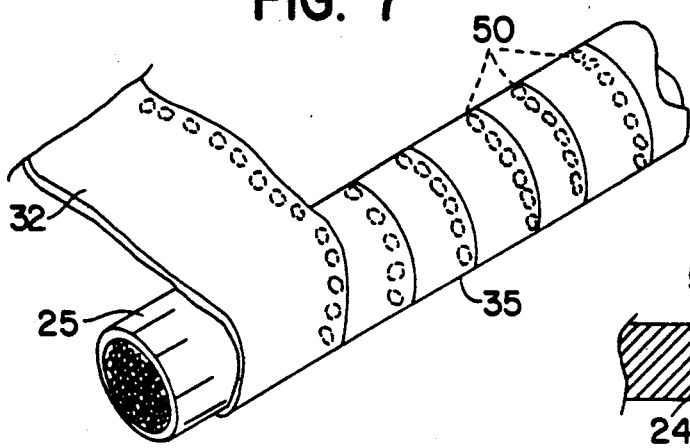
FIG. 7 is a perspective view showing a shield formed of a sheet of conductive material wrapped on an elongated body to be shielded.
Figure 8:
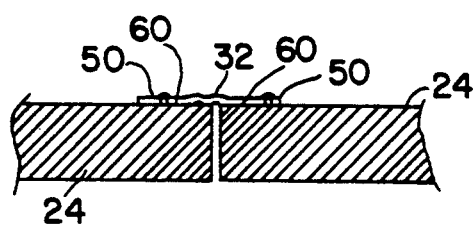
FIG. 8 is a section view directed longitudinally along a seam with a shield formed of a sheet of conductive material attached along edges to conductive panels; and, FIGS. 9a-9c illustrations of additional forms of shielding seals to which the invention is applicable, FIGS. 9a and 9b being in perspective and FIG. 9c being in elevation.

A conductive seam using discontinuous adhesive can be used for other forms of shielding, as shown for example in FIGS. 7 and 8. In these embodiments the shield involves the conductive attachment of a sheet-like conductive material to articles to be shielded In FIG. 7, the shield material 32 is arranged to shield a cable 25. The shield material can be wrapped to form a longitudinal seam, or as shown, the shield material can form a seam that proceeds helically along the cable 25. As above, the shield material is conductive, for example being made of a metal foil, metal plated or conductively coated paper or fabric, or the like. The shield material 32 overlaps each previous wrap of shield material to form a seam 35 at which the conductive material of the shield is physically attached and placed in electrically conductive contact with the previous wrap. This is accomplished using a discontinuous pattern of adhesive, preferably with a broken line of segments which extend laterally of the helical seam and are non-overlapping along the (helical) line of the seam. The helical wrapping of the shield material 32 tends to provide the necessary inward force to urge the wraps into contact in the exposed areas between the discontinuous adhesive areas, and this inward force can be increased by using a conductive shield material which stretches resiliently to some extent, for example a conductively coated fabric material.

In FIG. 8, a sheet form of conductive shield is attached via a discontinuous series of inclined adhesive lines to each of two conductive panels 24. FIG. 8 is a cross-section viewed along the axis of the two seams formed between the conductive shield material 32 and the two panels 24. As is apparent from FIG. 8, very little of the lateral extension of the material 32 bridging across the conductive panels is occupied by the adhesive and most of the lateral extension of the shield material is in direct surface contact with the panels. Accordingly, a secure and quite conductive bridge is formed between the two panels for blocking propagation of electromagnetic interference.

Figure 9A:
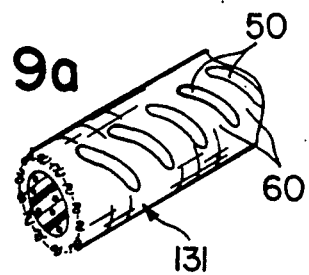
Figure 9B:
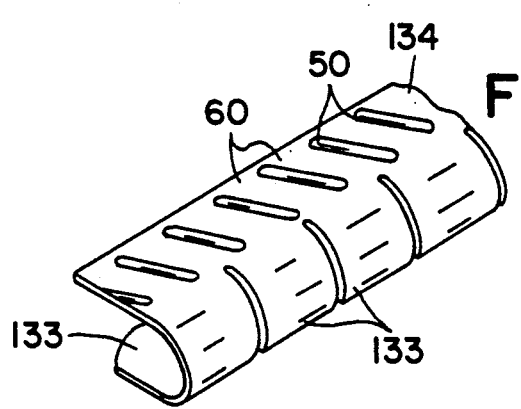
Figure 9C:
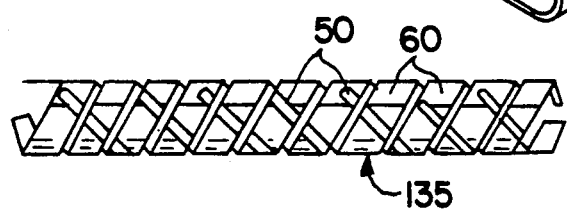

FIGS. 9a-9c illustrate application of the discontinuous adhesive to additional forms of conductive seals. Each of the illustrated embodiments is compressible. In FIG. 9a, a wire knit or mesh 131 forms the conductive material of the seal and is arranged on a cylindrical compressible core. The adhesive lines 50 are provided on a side of the seal to define a section of a helix on the conductive mesh or knit. When the seal is compressed in use, the core flattens the adhesive against a panel (or a groove in a panel, etc.) to obtain a conductive seam.

FIGS. 9b illustrates application of a discontinuous adhesive to an electromagnetic seal of the type having resilient conductive tongues 133 protruding from a conductive base strip 134. The base strip 134 is conductively and physically joined to a panel or the like using the discontinuous pattern of adhesive as described above, and the tongues bear against an opposed panel to obtain a conductive bridge between the panels The seal can be integral sheet metal or can be a conductively coated resilient material such as plated or coated plastic.

In FIG. 9c, the seal has helically wrapped conductive material. The inclined lines of adhesive, as in the embodiment of FIG. 9a, run along a side of the substantially cylindrical shape of the seal. The adhesive lines in the arrangement shown are further made discontinuous by the gaps between successive wraps of the helical conductive material, which can be sheet metal, conductively coated plastic, etc., and is also arranged to be compressed between conductive panels or the like.

The invention can also be considered a method for mounting a seal against passage of electromagnetic energy through an abutment of conductive panels, or a method for blocking electromagnetic energy. The method includes providing a conductive shield material 32 of the type described, in an indefinite length, for example on a compressible core 34. An adhesive 50 is applied to a surface 36 of the conductive material, the adhesive being discontinuous along the length of a seam to be formed using the shield material, the adhesive defining a plurality of areas 50 of adhesive, separated by areas 60 wherein the conductive material 32 is exposed directly. The seam is formed by attaching the shield material via said adhesive 50 to at least one conductive surface such as the surface of conductive panels to be bridged by the shield. The panels can be brought into abutment with the seal interspersed, whereby conductivity between the panels includes a conductive path from the panels directly to the exposed areas of the conductive shield material. Conduction between the panels or the like occurs through the conductive shield material 32. The conductive material can be arranged as a sheet or as a sheath on a compressible form or core. The shield material or sheath can be rendered conductive due to its composition (e.g., including a metallic form, foil or mesh, and/or can have a conductive coating).

Preferably, the adhesive is applied such that the areas 50 of adhesive and the areas 60 wherein the conductive sheath is exposed define a regular repetitive pattern 52 along the length of the seal. The pattern is preferably a series of spaced lines on the surface of the conductive sheath, in a proportion of 5-40% adhesive to 95-60% exposed area, preferably in a proportion of substantially 40% adhesive area to 60% exposed area. The lines should be inclined laterally relative to the seam to be formed, with the ends of each segment longitudinally coextensive with a next segment so as to be non-overlapping along the seam. Prior to mounting the seal on the panels, the seal can be protected by attaching a release liner to the conductive material via said adhesive. The release liner is removed before attaching the conductive material to form the seam.

Although the method is specific to EMI shielding, the adhesive applied to the conductive sheath can be conductive or nonconductive, in either case sufficient conductivity bridging across the gap between the panels is provided by the conductive sheath in surface contact with the panels, together with good adhesion. A preferred adhesive is nonconductive hot melt adhesive.

The invention having been disclosed, a number of variations will now occur to persons skilled in the art of EMI shielding. Reference should be made to the pending claims rather than the foregoing discussion of exemplary embodiments to determine the scope of the invention in which exclusive rights are claimed.

We claim:

1. An apparatus for shielding against passage of electromagnetic energy through a seam with a conductive body, comprising:
   a conductive seal of indefinite length, operative to conduct laterally of a longitudinal extension of the seal;
   an adhesive disposed on a surface of the conductive seal, the adhesive being discontinuous along said length of the seal, thereby defining a plurality of areas of adhesive, for attaching the seal physically across the seam, separated by areas wherein the seal is exposed directly, for coupling the seal electrically across the seam, the areas of adhesive and the exposed areas defining a regular repetitive pattern along the length of the seal, in a proportion of about 5% to 40% adhesive area to 60% to 95% exposed area.

2. The apparatus according to claim 1, wherein the plurality of areas of adhesive define a broken line on the surface of the conductive seal at the seam.

3. An apparatus for shielding against passage of electromagnetic energy through a seam with a conductive body, comprising:
a conductive seal of indefinite length, operative to conduct laterally of a longitudinal extension of the seal;
an adhesive disposed on a surface of the conductive seal, the adhesive being discontinuous along said length of the seal, thereby defining a plurality of areas of adhesive, for attaching the seal physically across the seam, separated by areas wherein the seal is exposed directly, for coupling the seal electrically across the seam, and wherein the areas of the adhesive define a succession of lines included laterally of the longitudinal extension of the seam.

4. The apparatus according to claim 3, wherein the areas of adhesive define lines which are non-overlapping as viewed laterally of the seam.

5. The apparatus according to claim 4, wherein an end of each of the lines is longitudinally coextensive and laterally spaced from and end of a next one of the lines.

6. An apparatus for shielding against passage of electromagnetic energy through a seam with a conductive body, comprising:
a conductive seal of indefinite length, operative to conduct laterally of a longitudinal extension to the seal;
an adhesive disposed on a surface of the conductive seal, the adhesive being discontinuous along said length of the seal, thereby defining a plurality of areas of adhesive, for attaching the seal physically across the seam, separated by areas wherein the seal is exposed directly, for coupling the seal electrically across the seam, the areas of adhesive and the exposed areas defining a regular repetitive pattern along the length of the seal, and wherein the adhesive is substantially nonconductive.

7. The apparatus according to claim 6, further comprising a release liner removably attached to the adhesive.

8. The apparatus according to claim 6, wherein the seam is defined between a compressible seal body and a conductive panel.

9. The apparatus according to claim 6, wherein the seam is defined between a conductive sheet edge and a conductive body.

10. The apparatus according to claim 6, wherein the seam is defined between overlapping portions of a conductive sheath.

11. A method for mounting a seal against passage of electromagnetic energy through a seam between conductive bodies, comprising the steps of:
providing a conductive seal of indefinite length, operable to conduct laterally of a longitudinal extension of the seam;
applying an adhesive to a surface of the conductive seal, the adhesive being discontinuous along said length of the seal and applied in a regular repetitive pattern, thereby defining a plurality of areas of adhesive for attaching the seal physically across the seam, separated by areas wherein the seal is exposed directly, for coupling the seal electrically across the seam, the adhesive being applied in a proportion of about 5% to 40% adhesive area to 60% to 95% exposed area; and,
attaching the seal via said adhesive to a surface of at least one of said conductive bodies.

12. The method according to claim 11, comprising applying the adhesive such that the plurality of areas of adhesive define a broken line on the surface of the at least one conductive body.

13. The method according to claim 11, further comprising attaching a release liner to the seal via said adhesive, and removing the release liner before attaching the seal to said one of the conductive bodies.

14. The method according to claim 11, wherein the adhesive applied is substantially nonconductive.

15. The method according to claim 14, wherein the adhesive is applied to form a regular pattern of successive lines inclined relative to a longitudinal extension of the seam.

16. The method according to claim 15, wherein the successive lines are applied such that an end of each of the lines is longitudinally coextensive with and laterally displaced from an end of a next successive line along the seam.

17. An apparatus for shielding against passage of electromagnetic energy through an abutment of conductive panels, comprising:
a seal body of indefinite length, having a conductive surface disposed on a compressible element;
an adhesive disposed on the conductive surface, the adhesive being discontinuous along said length of the seal body, thereby defining a plurality of areas of adhesive, for attaching the seal body to at least one said panel, separated by areas wherein the conductive surface is exposed directly, for conductive contact with the panel, the adhesive defining a regular repetitive pattern along the length of the seal in a proportion of substantially 5% to 40% adhesive area, to 60% to 95% exposed area.

18. The apparatus according to claim 17, wherein the plurality of areas of adhesive define a broken pattern of spaced lines on the conductive surface.

19. The apparatus according to claim 17, further comprising a release liner removably attached to the conductive surface via the adhesive.

20. The apparatus according to claim 17, wherein the conductive surface is defined by a conductive sheath on a compressible core.

21. The apparatus according to claim 17, wherein the conductive surface is defined by a flexible conductive sheet.

22. An apparatus for shielding against passage of electromagnetic energy through an abutment of conductive panels, comprising:
a seal body of indefinite length, having a conductive surface disposed on a compressible element;
an adhesive disposed on the conductive surface, the adhesive being discontinuous along said length of the seal body, thereby defining a plurality of areas of adhesive, for attaching the seal body to at least one of said panel, separated by areas wherein the conductive surface is exposed directly, for conductive contact with the panel, and wherein the adhesive is substantially nonconductive.

23. A method for mounting a seal against passage of electromagnetic energy through an abutment of conductive panels, comprising the steps of:
   providing a seal body of indefinite length, having a conductive surface;
   applying an adhesive to the surface, the adhesive being discontinuous along said length of the seal body, and defining a plurality of areas of adhesive in a regular repetitive pattern along the length of the seal, for attaching the seal to at least one said panel, separated by areas wherein the conductive sheath is exposed directly, for conductive contact with the panel, the areas of adhesive and the areas exposed being provided in a proportion of substantially 40% adhesive area to 60% exposed area;
   attaching the seal via said adhesive to one of said conductive panels;
   bringing the panels into abutment with the seal interspersed, whereby conductivity between the panels includes a conductive path from the panels directly to the exposed areas of the conductive surface.

24. The method according to claim 23, comprising applying the adhesive such that the plurality of areas of adhesive define spaced dots on the surface of the conductive sheath.

25. The method according to claim 23, further comprising attaching a release liner to the adhesive conductive sheath via said adhesive, and removing the release liner before attaching the seal to said one of the panels.

26. A method for mounting a seal against passage of electromagnetic energy through an abutment of conductive panels, comprising the steps of:
   providing a seal body of indefinite length, having a conductive surface;
   applying an adhesive to the surface, the adhesive being a nonconductive hot metal adhesive applied in a discontinuous pattern along said length of the seal body, and defining a plurality of areas of adhesive in a regular repetitive pattern along the length of the seal, for attaching the seal to at least one said panel, separated by areas wherein the conductive sheath is exposed directly, for conductive contact with the panel;
   attaching the seal via said adhesive to one of said conductive panels;
   bringing the panels into abutment with the seal interspersed, whereby conductivity between the panels includes a conductive path from the panels directly to the exposed areas of the conductive surface.

* * * * *